United States Patent [19]

Gillery

[11] Patent Number: 4,622,120

[45] Date of Patent: Nov. 11, 1986

[54] SPUTTERED INDIUM OXIDE FILMS

[75] Inventor: F. Howard Gillery, Allison Park, Pa.

[73] Assignee: PPG Industries, Inc., Pittsburgh, Pa.

[21] Appl. No.: 575,604

[22] Filed: Jan. 31, 1984

[51] Int. Cl.[4] ............................................. C23C 15/00
[52] U.S. Cl. ......................... 204/192.26; 204/192.12; 427/165; 427/166; 428/432; 428/642; 428/699; 428/701
[58] Field of Search ............... 428/432, 699, 701, 642; 204/192 R, 192 D; 427/165, 166

[56] References Cited

U.S. PATENT DOCUMENTS

| | | | |
|---|---|---|---|
| 3,537,881 | 11/1970 | Corwin | 428/642 X |
| 3,920,533 | 11/1975 | Pompéi | 204/192 P |
| 3,935,351 | 1/1976 | Franz | 428/433 X |
| 3,944,440 | 3/1976 | Franz | 427/165 X |
| 4,013,532 | 3/1977 | Cormia et al. | 204/164 |
| 4,065,626 | 12/1977 | Franz | 427/165 X |
| 4,094,763 | 6/1978 | Gillery et al. | 204/192 P |
| 4,098,956 | 7/1978 | Blickensderfer et al. | 428/469 X |
| 4,113,599 | 9/1978 | Gillery | 204/192 P |
| 4,166,018 | 8/1979 | Chapin | 204/192 R |
| 4,201,649 | 5/1980 | Gillery | 204/192 R |
| 4,337,990 | 7/1982 | Fan et al. | 204/192 P |
| 4,421,622 | 12/1983 | Hollars | 204/192 P |
| 4,450,201 | 5/1984 | Brill et al. | 428/469 X |
| 4,462,883 | 7/1984 | Hart | 204/192 R |
| 4,462,884 | 7/1984 | Gillery et al. | 204/192 SP |
| 4,496,700 | 2/1985 | Groth et al. | 428/433 X |

FOREIGN PATENT DOCUMENTS 6089724 7/1981 Japan ................................. 428/432

*Primary Examiner*—Arthur P. Demers
*Attorney, Agent, or Firm*—Donna L. Seidel

[57] ABSTRACT

A method for improving the adhesion of metal to metal oxide films is disclosed, along with improved coated articles produced thereby. The method comprises depositing between a metal and a metal oxide layer a metal containing layer having affinity for both the metal and metal oxide layers . . .

20 Claims, No Drawings

SPUTTERED INDIUM OXIDE FILMS

BACKGROUND OF THE INVENTION

The present invention relates generally to the art of cathode sputtering of indium oxide films, and more particularly to the art of magnetic sputtering of multiple layer films such as indium oxide and silver.

U.S. Pat. No. 4,094,763 to Gillery et al discloses producing transparent, electroconductive articles by cathode sputtering metals such as tin and indium onto refractory substrates such as glass at a temperature above 400° F. in a low pressure atmosphere containing a controlled amount of oxygen.

U.S. Pat. No. 4,113,599 to Gillery teaches a cathode sputtering technique for the reactive deposition of indium oxide in which the flow rate of oxygen is adjusted to maintain a constant discharge current while the flow rate of argon is adjusted to maintain a constant pressure in the sputtering chamber.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface.

U.S. Pat. No. 4,201,649 to Gillery discloses a method for making low resistance indium oxide thin films by first depositing a very thin primer layer of indium oxide at low temperature before heating the substrate to deposit the major thickness of the conductive layer of indium oxide by cathode sputtering at typically high cathode sputtering temperatures.

High light transmittance, low emissivity coatings of the type metal oxide/metal/metal oxide are known in the cathode sputtering art. Indium oxide/silver/indium oxide has good optical and spectral properties. However, in the cathode sputtering of multiple layer films such as indium oxide/silver/indium oxide, adhesion between the coating layers is a characteristic in need of improvement. For example, the adhesion of indium oxide to silver is so poor that if a coated glass sheet is to be assembled into a double glazed unit, the coating must be stripped from the area of the unit seals to avoid seal failure. In addition, when the top oxide layer is deposited, oxidation of the intermediate metallic layer reduces its conductivity and emissivity and is therefore undesirable. The present invention deals with both of these problems.

SUMMARY OF THE INVENTION

The present invention provides a method for improving the adhesion between metal oxide and metal layers, as well as minimizing the oxidation of the metal layer. In a process for depositing a multiple layer film such as indium oxide/silver/indium oxide on a substrate such as glass, the method of the present invention involves depositing an intermediate layer between the metal and metal oxide layers. The intermediate layer comprises a composition which has an affinity for both the metal and the metal oxide layers in order to provide improved adhesion between the metal and metal oxide layers. An intermediate layer of silver oxide, for example, has an affinity for both the metallic silver layer and the indium oxide layer. An intermediate layer of metallic indium or indium oxide in a reduced state relative to the primary indium oxide layer likewise has an affinity for both the metallic silver layer and the indium oxide layer. In addition, because these intermediate layers are deposited in a relatively reduced state, oxidation of the metal layer is minimized.

DETAILED DESCRIPTION OF THE PREFERRED EMBODIMENTS

Nonmetallic substrates, preferably transparent substrates, are coated with various metal and metal oxide films. Cathode sputtering, preferably magnetically enhanced, is a preferred method for depositing preferred high light transmittance, low emissivity films. Such films typically comprise multiple layers, preferably a layer of a highly reflective metal such as gold, silver or copper sandwiched between anti-reflective metal oxide layers such as indium oxide or titanium oxide. The preferred reflective metals are typically not readily oxidized, and their lack of affinity for oxygen results in poor adhesion to the metal oxide layers. The present invention solves this adhesion problem by providing an intermediate layer between the metal and metal oxide layers which has an affinity for both. The intermediate layer is preferably an oxide of the not readily oxidized metal of the metal layer, or more preferably a layer containing the metal of the metal oxide layer, either in the metallic state or in the oxide state but reduced relative to the metal oxide layer.

In a conventional magnetron sputtering process, a substrate is supported within a coating chamber in facing relation with a cathode having a target surface of the material to be sputtered. Preferred substrates in accordance with the present invention include glass, ceramics and plastics which are not detrimentally affected by the operating conditions of the coating process.

The cathodes may be of any conventional design, preferably an elongated rectangular design, connected with a source of electrical potential, and preferably employed in combination with a magnetic field to enhance the sputtering process. At least one cathode target surface comprises a metal to be sputtered to form the reflective, conductive metallic layer. At least one other cathode target surface comprises a metal such as indium or titanium which is sputtered in a reactive atmosphere to form an anti-reflective layer such as indium or titanium oxides. The anode is preferably a symmetrically designed and positioned assembly as taught in U.S. Pat. No. 4,478,702 to Gillery et al, the disclosure of which is incorporated herein by reference.

In a preferred embodiment of the present invention, multiple layer films such as indium oxide/silver/indium oxide are deposited on glass. A clean glass substrate is placed in a coating chamber which is evacuated, preferably to less than $10^{-4}$ torr, more preferably less than $2 \times 10^{-5}$ torr. A selected atmosphere of inert and reactive gases, preferably argon and oxygen, is established in the chamber to a pressure between about $5 \times 10^{-4}$ and $5 \times 10^{-3}$ torr. A cathode having a target surface of indium metal is operated, preferably in a scanning mode, over the surface of the substrate to be coated. The target metal is sputtered, reacting with the atmosphere in the chamber to deposit an indium oxide coating layer on the glass surface.

After the initial indium oxide layer is deposited, the coating chamber is evacuated, and an inert atmosphere such as pure argon is established at a pressure between about $6 \times 10^{-4}$ and $6 \times 10^{-3}$ torr. A cathode having a target surface of silver metal is operated, also preferably in a scanning mode, over the indium oxide coated surface. The target metal is sputtered and deposits a reflective, conductive metallic layer on the indium oxide coated glass surface. Prior to the present invention, a second indium oxide coating layer would be deposited on the silver layer under essentially the same conditions used to deposit the first indium oxide layer.

In accordance with the present invention, before the second indium oxide layer is deposited, a coating in a relatively reduced state containing indium is deposited on the silver coating layer. The intermediate indium-containing layer may be indium metal, but is preferably indium oxide in a relatively reduced state in order to maintain high light transmittance. In another preferred embodiment of the invention, a similar indium-containing layer may be deposited between the first indium oxide coating layer and the metallic silver layer.

After the intermediate layer in a relatively reduced state containing indium is deposited on the silver coating layer in accordance with the present invention, the second indium oxide coating layer is deposited under essentially the same conditions as the initial indium oxide coating layer. The preferred multiple layer coating of the present invention thus comprises at least four layers; (1) a first metal oxide layer, (2) a metallic layer, (3) a relatively reduced intermediate layer and (4) a second metal oxide layer, and may comprise a fifth (5) a relatively reduced intermediate layer between the metal and the first metal oxide layers.

The relatively reduced intermediate layer provides improved adhesion between the metal and metal oxide layers, as well as minimizing oxidation of the metallic layer. The intermediate layers of the present invention provide improved adhesion without adversely affecting the solar energy performance and optical properties of the primary coating layers. Preferred articles in accordance with the present invention have a luminous transmittance of at least 70 percent, more preferably at least 75 percent. The present invention will be further understood from the descriptions of specific examples which follow.

EXAMPLE I

A multiple layer coating of indium oxide/silver/indium oxide is deposited on a glass substrate by magnetically enhanced cathode sputtering under the following conditions. For depositing the first indium oxide layer, the argon flow rate is 740 cubic centimeters per minute, the oxygen flow rate is 380 cc per minute, and the final pressure in the chamber is $8.5 \times 10^{-4}$ torr. A cathode having a target surface comprising 80 percent indium and 20 percent tin is scanned at a speed of 100 inches (2.54 meters) per minute over a glass substrate which has an initial luminous transmittance of about 90 percent. The cathode is powered by 360 volts at a current of 5.2 amps, resulting in a deposition rate of about 21 Angstroms per second. The resultant indium oxide coating lowers the luminous transmittance of the coated glass to about 79.9 percent. For depositing the second coating layer of metallic silver, the coating chamber is evacuated, and an atmosphere of 100 percent argon is established at a pressure of $8.5 \times 10^{-4}$ torr using an argon flow rate of 1240 cc/minute. A cathode having a target surface of silver is powered by 500 volts at a current of 6.3 amps, and scanned at a speed of 320 inches (8.1 meters) per minute to deposit a metallic silver layer over the indium oxide layer, lowering the luminous transmittance of the coated glass to about 61.8 percent. Finally, the second indium oxide layer is deposited over the silver layer at essentially the same conditions as the first indium oxide layer, raising the luminous transmittance back up to 79.7 percent. The coated surface has a resistivity of 10 to 12 ohms per square. The poor adhesion of the film is evidenced by the fact that the indium oxide is readily removed upon contact with standard adhesives, for example Scotch ® tape.

EXAMPLE II

In accordance with the present invention, an indium oxide/silver/indium oxide coating is deposited on a glass substrate by cathode sputtering under conditions such as those described in Example I, with the exception that a metallic indium layer is deposited between the indium oxide and silver layers as follows. For depositing the first indium oxide layer, the argon and oxygen flow rates are 680 and 380 cc/minute, respectively, the pressure is $8.4 \times 10^{-4}$ torr, power is 350 volts, current is 5 amps, cathode scanning speed is 100 inches (2.54 meters) per minute, and the deposition rate is 21 Å/second. The indium oxide layer lowers the luminous transmittance from 90 percent for the glass alone to about 78.8 percent. Next, in an atmosphere of 100 percent argon at a pressure $8 \times 10^{-4}$ torr and a flow rate of 1080 cc/minute, the indium cathode is scanned at a maximum speed of 320 inches (8.1 meters) per minute, and sputtered at minimum power of 270 volts at 0.8 amps in order to deposit an indium layer of minimum thickness so that the luminous transmittance of the final article can be maximized. The indium layer lowers the transmittance from 78.8 to 71.9 percent. In the same argon atmosphere, the silver cathode is scanned at 320 inches (8.1 meters) per minute, powered at 500 volts at a current of 6.2 amps to deposit a metallic silver layer which lowers the transmittance from 71.9 to 55.5 percent. A second metallic indium layer is then deposited under the same conditions as the first, lowering the luminous transmittance from 55.5 to 47.9 percent. Finally, a reactive atmosphere is re-established with an argon flow rate of 720 cc/minute and an oxygen flow rate of 400 cc/minute at a pressure of $8.4 \times 10^{-4}$ torr. The indium cathode is scanned at 100 inches (2.54 meters) per minute, and sputtered at 350 volts, 5 amps, for an indium oxide deposition rate of 21 Angstroms per second. The second indium oxide film raises the luminous transmittance from 47.9 to 72.3 percent. The final coating has a resistivity of 10 to 12 ohms per square, and good adhesion, as shown by the fact that the coating is not removed by Scotch ® tape.

EXAMPLE III

Since a higher final luminous transmittance is preferred to that obtained in Example II, the metallic indium intermediate layers are replaced in this example with indium oxide in a reduced state relative to the primary indium oxide layers. The first indium oxide layer is deposited as in the previous examples with the argon flow 840 cc/minute, oxygen flow 400 cc/minute, pressure $9 \times 10^{-4}$ torr, power 350 volts, current 5 amps, scanning speed 100 inches (2.54 meters) per minute, and deposition rate 21 Angstroms/second. The indium oxide layer lowers the luminous transmittance of the glass from 90 percent to 79.2 percent. Then the oxygen concentration in the chamber is lowered by increasing the argon flow rate to 1000 cc/minute and decreasing the oxygen flow rate to 210 cc/minute while maintaining the pressure at $9 \times 10^{-4}$ torr. Again scanning at maximum speed of 320 inches (8.1 meters) per minute and sputtering at minimum power of 270 volts and current of 0.8 amps, indium oxide in a relatively reduced state is deposited at a rate of 4 Angstroms per second. The relatively reduced indium oxide layer decreases the luminous transmittance only from 79.2 to 78.9 percent. Next, the silver layer is sputtered as in the previous examples, argon flow 1080 cc/minute, pressure $9 \times 10^{-4}$ torr, power 500 volts, current 6.2 amps, and scanning speed 320 inches (8.1 meters) per minute. The silver layer lowers the luminous transmittance from 78.9 to 61.4 percent. A second intermediate indium oxide layer in a relatively reduced state is deposited over the silver under the same conditions as the first reduced indium oxide intermediate layer, decreasing the luminous transmittance only from 61.4 to 59.4 percent. Finally, the second primary indium oxide layer is deposited under the same oxidizing conditions as the first primary indium oxide layer, raising the luminous transmittance from 59.4 to 78.2 percent for the final coated article. The adhesion is acceptable as shown by the fact that the coating is not removed upon contact with Scotch tape.

The above examples are offered to illustrate the present invention. Although the above examples describe intermediate layers of indium and reduced indium oxide, an intermediate layer of silver oxide would be suitable in an indium oxide/silver/indium oxide coating. Other metals and metal oxides would be preferred as intermediate layers in other coating configurations. Variations and modifications in the coating compositions and processes are included within the scope of the present invention as defined by the following claims.

I claim:

1. In a method for depositing on a substrate multiple layer films comprising at least one primary layer of a metal oxide and at least one primary layer of a metal other than the metal of the oxide layer, the improvement which comprises improving the adhesion between the metal oxide and metal layers by depositing between said layers an intermediate metal-containing layer having an affinity for both the metal and metal oxide layers.

2. The improved method according to claim 1, wherein said intermediate layer comprises an oxide of the metal of the metal layer.

3. The improved method according to claim 1, wherein said intermediate layer comprises the metal of the metal oxide layer and is in a reduced state relative to the metal oxide layer.

4. The improved method according to claim 3, wherein said intermediate layer is in an essentially metallic state.

5. The improved method according to claim 3, wherein said intermediate layer is in a metal oxide state.

6. The improved method according to claim 1, wherein the metal and metal oxide layers are deposited by cathode sputtering.

7. The improved method according to claim 6, wherein the metal layer is selected from the group consisting of gold, silver and copper.

8. The improved method according to claim 7, wherein the metal oxide layer is selected from the group consisting of indium oxide and titanium oxide.

9. The improved method according to claim 8, wherein the metal layer is deposited between two layers of metal oxide.

10. The improved method according to claim 9, wherein an intermediate layer is deposited between the metal layer and the second metal oxide layer.

11. The improved method according to claim 9, wherein intermediate layers are deposited between the metal layer and both metal oxide layer.

12. The improved method according to claim 9, wherein the metal oxide is indium oxide.

13. The improved method according to claim 12, wherein the intermediate layer is indium.

14. The improved method according to claim 12, wherein the intermediate layer is indium oxide in a reduced state relative to the primary indium oxide layer.

15. The improved method according to claim 1, wherein the multiple layer film is deposited on a glass substrate.

16. The improved method according to claim 15, wherein the final luminous transmittance of the coated glass is at least 70 percent.

17. An article of manufacture comprising a nonmetallic substrate, and deposited thereon in any order
   a. at least one coating layer of metal;
   b. at least one coating layer of an oxide of a metal other than the metal of the metal layer; and
   c. deposited between said metal and metal oxide layers an intermediate metal-containing layer having an affinity for both the metal and metal oxide layers.

18. An article according to claim 17, comprising:
   a. a transparent substrate;
   b. a primary coating layer of a metal selected from the group consisting of gold, silver and copper;
   c. a primary coating layer of a metal oxide selected from the group consisting of titanium oxide and idium oxide; and
   d. an intermediate layer selected from the group consisting of the oxide of the metal of the metal layer, the metal of the oxide layer, and the metal oxide of the metal oxide layer in a reduced state relative to the metal oxide layer.

19. An article according to claim 18, comprising:
   a. a glass substrate;
   b. deposited on a surface of said glass substrate a first transparent primary coating layer of indium oxide;
   c. a transparent primary layer of silver deposited on said indium oxide layer;
   d. deposited on said silver layer a transparent intermediate layer selected from the group consisting of indium and indium oxide in a reduced state relative to said primary layer of indium oxide; and
   e. a second transparent primary layer of indium oxide deposited on said intermediate layer.

20. An article according to claim 19, wherein the luminous transmittance of the coated article is at least 70 percent.

* * * * *

UNITED STATES PATENT AND TRADEMARK OFFICE
CERTIFICATE OF CORRECTION

PATENT NO. : 4,622,120

DATED : November 11, 1986

INVENTOR(S) : F. Howard Gillery

It is certified that error appears in the above-identified patent and that said Letters Patent is hereby corrected as shown below:

Column 6, line 42, Claim 18: "idium" should read "indium".

Signed and Sealed this

Sixteenth Day of February, 1988

Attest:

DONALD J. QUIGG

Attesting Officer

Commissioner of Patents and Trademarks